United States Patent [19]
Hudspeth et al.

[11] Patent Number: 4,831,334
[45] Date of Patent: May 16, 1989

[54] ENVELOPE AMPLIFIER

[75] Inventors: Thomas Hudspeth, Malibu; David S. Kaplan, Torrance; Harold A. Rosen, Santa Monica, all of Calif.

[73] Assignee: Hughes Aircraft Company, Los Angeles, Calif.

[21] Appl. No.: 59,709

[22] Filed: Jun. 8, 1987

[51] Int. Cl.⁴ .................... H03F 3/38; H03F 3/189
[52] U.S. Cl. ................... 330/10; 330/124 R; 330/295
[58] Field of Search ............ 330/10, 202, 297, 124 R, 330/295; 455/341; 328/21, 22

[56] References Cited

U.S. PATENT DOCUMENTS

| | | | |
|---|---|---|---|
| 3,319,175 | 5/1967 | Dryden | 330/263 X |
| 4,205,241 | 5/1980 | Fisher et al. | 330/10 X |
| 4,403,197 | 9/1983 | Swanson | 330/10 |
| 4,560,944 | 12/1985 | Furrer | 330/10 |

FOREIGN PATENT DOCUMENTS

| | | | |
|---|---|---|---|
| 0083727 | 7/1983 | European Pat. Off. | |
| 147306 | 7/1985 | European Pat. Off. | 330/297 |
| 0151345 | 8/1985 | European Pat. Off. | |

OTHER PUBLICATIONS

Patent Abstracts of Japan, vol. 6, No. 60 (E-102) (938), Apr. 17, 1982, & JP, A, 572107 (Pioneer K.K.) Jan. 7, 1982.

Patent Abstracts of Japan, vol. 6, No. 99(E-111) (977), Jun. 8, 1982, & JP, A, 5732104 (Hitachi Seisakusho K.K.) Feb. 20, 1982.

Primary Examiner—James B. Mullins
Attorney, Agent, or Firm—Steven M. Mitchell; Mark J. Meltzer; A. W. Karambelas

[57] ABSTRACT

A high efficiency envelope amplifier is disclosed. The invention includes a power supply, a comparator and several switches. The power supply is capable of providing multiple outputs. The comparator measures the amplitude of an input signal against one of several threshold levels. When the input signal is within a predetermined range, a selected power supply output is switched onto the output path. Since the present invention incrementally switches small amounts of power, switching losses are substantially mitigated.

1 Claim, 6 Drawing Sheets

FIG. 7(a)
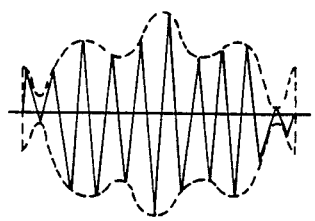
FIG. 7(b)
FIG. 7(d)
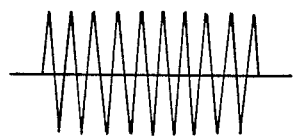
FIG. 7(c)
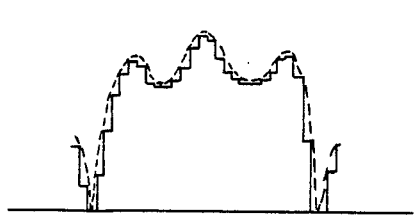
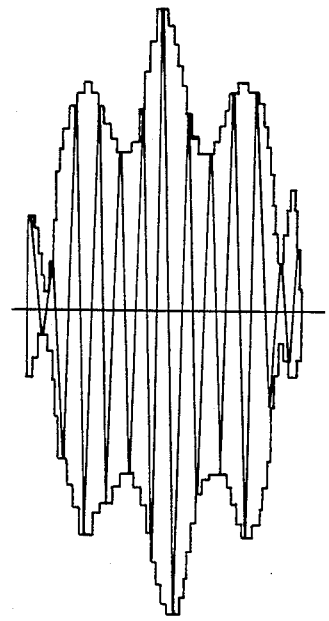
FIG. 7(e)

ENVELOPE AMPLIFIER

BACKGROUND OF THE INVENTION

1. Field of the Invention

The present invention relates to amplifiers. More specifically, the present invention relates to high frequency RF amplifiers employing an envelope elimination and restoration technique (EER).

While the present invention is described herein with reference to a illustrative embodiment for a particular application, it is understood that the invention is not limited thereto. Those of ordinary skill in the art and access to the teachings provided herein will recognize additional modifications, applications and embodiments within the scope thereof.

2. Description of the Related Art

To improve the efficiency of linear radio frequency (RF) amplifiers certain techniques have been developed. Envelope elimination and restoration (EER) is one such technique. As described in "Single Sideband Transmission by Envelope Elimination and Restoration" by L. R. Kahn in the July 1952 Proceedings of the I.R.E., pp. 803–806 and in "Comparison of Linear Single-Sideband Transmitters with Envelope Elimination and Restoration Single-Sideband Transmitters" by L. R. Kahn, in the December 1956 Proceedings of the I.R.E., pp. 1706–1712, this scheme provides a method for amplifying a variable amplitude signal by separately amplifying its phase and envelope components. The input signal is amplitude limited so that a signal containing only phase modulation is amplified by the high efficiency RF amplifier. This permits the operation of a high efficiency RF amplifier, e.g. a Class C amplifier, at constant drive power. The envelope of the input signal is processed in a separate path to provide a modulated power supply for the RF amplifier. As the output of the RF amplifier varies in response to its supply, the envelope of the signal is restored as part of the properly amplified output signal.

In a typical system, the modulator includes an envelope detector and an envelope amplifier. If the modulator is of sufficiently high efficiency, the overall efficiency of the EER system may exceed that of the linear Class A or Class B amplifier that would otherwise be required to deal with the variable amplitude signal. The efficiency of the envelope amplifier is therefore a driver with respect to the efficiency of the overall system. Thus, variable duty cycle high switching speed converters have been used as envelope amplifiers. However, the switching speed of variable duty cycle high switching speed converters must be sufficiently higher than the signal bandwidth to permit removal of the switching frequency components by a suitable filter. For wide bandwidth signals, the switching frequency may be so high that the attendant switching losses significantly degrade the amplifier efficiency. This is a significant limitation on the use of variable duty cycle switching converters as envelope amplifiers.

There is therefore a need in the art for an envelope amplifier for use with an EER system which offers high frequency operation with significantly reduced switching losses.

SUMMARY OF THE INVENTION

The problems of conventional envelope elimination and restoration systems are addressed by the envelope amplifier of the present invention which includes a power supply, a comparator and a number of switches. The power supply is capable of providing selectable output voltages. The comparator measures the amplitude of an input signal against one of several threshold levels. When the input signal is in a predetermined range, a selected power supply output is switched onto the output path. Since the present invention incrementally switches small amounts of power, switching losses are substantially mitigated.

BRIEF DESCRIPTION OF THE DRAWINGS

FIG. 7(a) shows a typical input signal of the form S(t).

FIG. 7(b) shows the form of the signal output from the detector utilized in an illustrative envelope elimination and restoration system in response to the input of the signal S(t) of FIG. 7(a).

FIG. 7(c) shows the form of the signal output from an envelope amplifier of an envelope elimination and restoration system in response to the input of the signal of the form shown in FIG. 7(b).

FIG. 7(d) shows the output of the limiter of an envelope elimination and restoration system in response to the input of the signal of the form shown in FIG. 7(a).

FIG. 7(e) shows the output of an RF amplifier of an envelope elimination restoration system in response to the input of the signal of the form shown in FIG. 7(a) when powered by a signal of the form shown in FIG. 7(c).

DESCRIPTION OF THE INVENTION

The present invention provides an envelope amplifier which extends the signal bandwidth over which a linear amplifier employing envelope elimination and restoration can be made to operate efficiently. The invention exhibits lower switching losses than a conventional amplifier using a variable duty cycle converter for envelope amplification.

Figure 1:
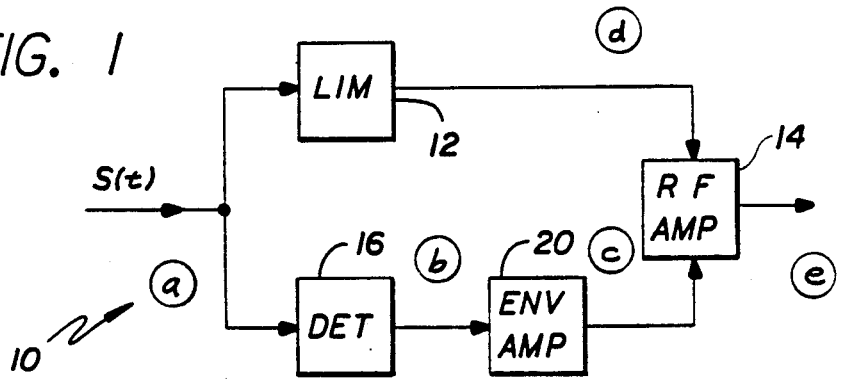
FIG. 1 is a block diagram of a high frequency amplification system utilizing envelope elimination and restoration.

A typical EER system is shown in FIG. 1. The envelope is removed from the input signal S(t) by a limiter 12. The limiter 12 supplies an amplitude limited phase and/or frequency modulated signal as an input to an RF amplifier 14. The envelope is restored by the combination of a conventional power detector 16 and an envelope amplifier 20. The envelope amplifier 20 amplifies the envelope of the input signal, as detected by the power detector 16, and uses it to modulate the power supply of the RF amplifier 14. By amplifying the phase and envelope components of the input signal separately, a high efficiency RF amplifier operating with constant drive power is achieved. If the envelope amplifier is of sufficiently high efficiency, the overall efficiency of the system may exceed that of a linear Class A or Class B amplifier which would otherwise be required to deal with the variable amplitude signal.

Figure 2:
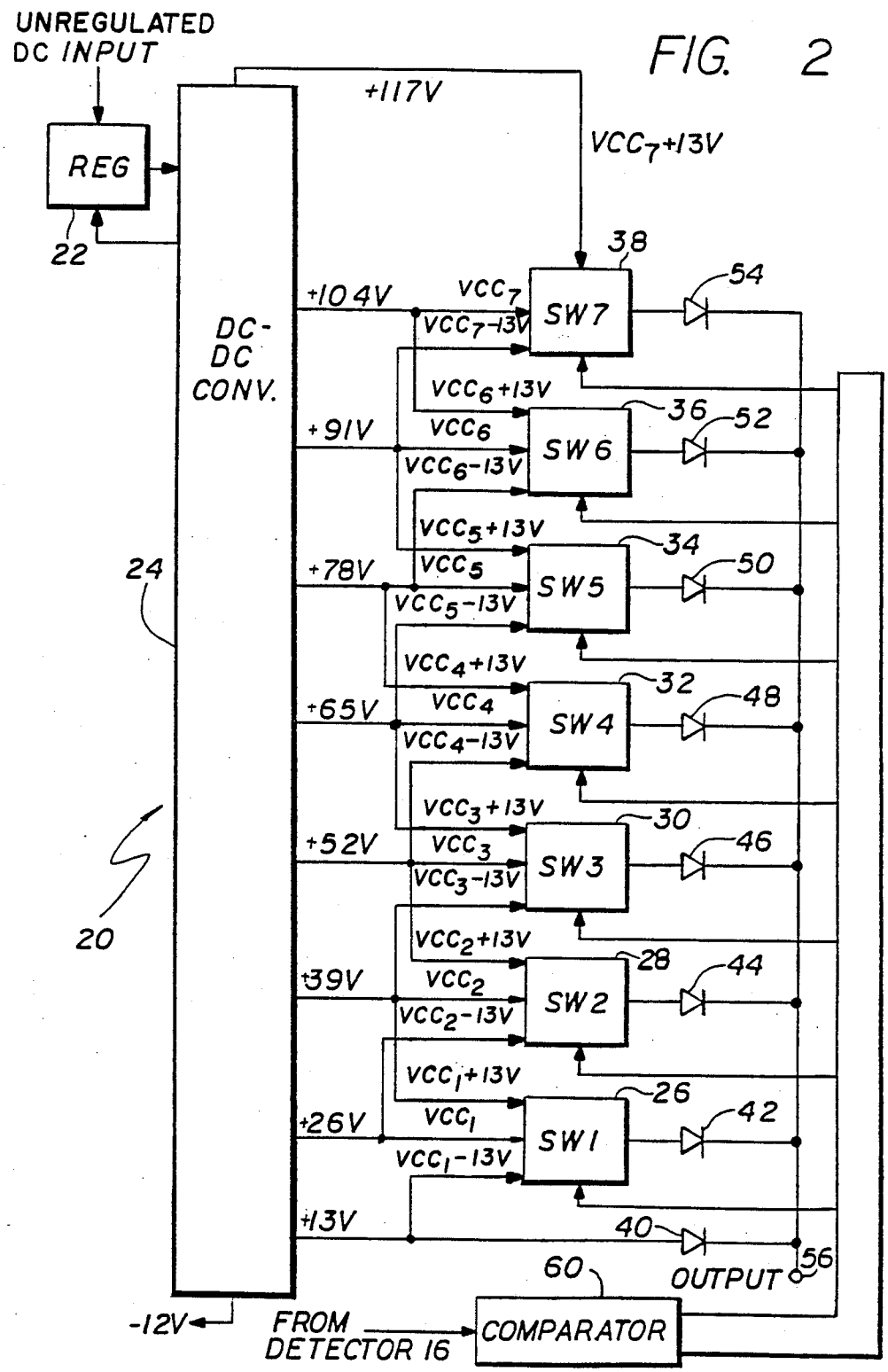
FIG. 2 is a block diagram of the envelope amplifier of the present invention.

As shown in FIG. 2, the present invention provides a high efficiency envelope amplifier 20 which includes a regulator 22, a DC to DC converter 24, a plurality of switches 26-38 (even numbers only), a plurality of diodes 40-54 (even numbers only), and a comparator 60. The components of the amplifier 20 are designed and selected for optimum efficiency.

Figure 3:
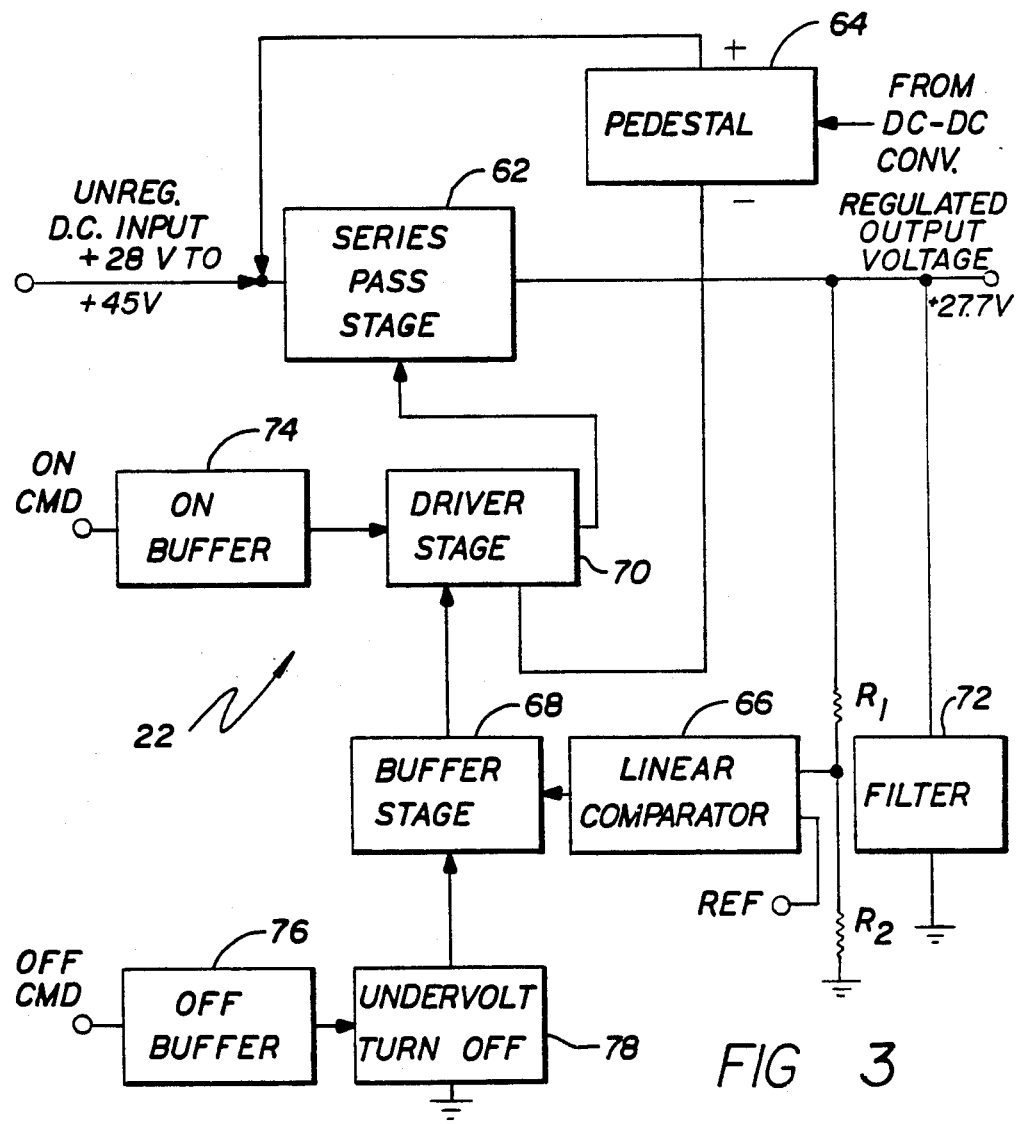
FIG. 3 is a block diagram showing a typical regulator suitable for use in the envelope amplifier of the present invention.

The regulator 22 receives DC input from a battery or an array of solar cells (not shown) and provides a regulated voltage for the DC to DC converter 24. An illustrative implementation of the regulator 22 is shown in FIG. 3. For optimal efficiency, the series pass stage 62 is supplied with a floating voltage pedestal 64 (e.g. 4 volts) by the DC to DC converter 24. A linear comparator 66 monitors the output of the series pass stage 62 through a voltage divider provided by resistors R1 and R2. The linear comparator 66 compares the sensed output level to a reference level and controls the series pass stage 62 through a buffer stage 68 and a driver stage 70. The output is filtered by a set of capacitors 72. The 'on' command is supplied through a first buffer 74 while the 'off' command is supplied through a second buffer 76. Undervoltage protection is provided by an undervoltage turnoff circuit 78. Those of ordinary skill in the art will recognize additional techniques for providing a regulated supply to the DC to DC converter 24 within the scope of the invention.

Figure 4:
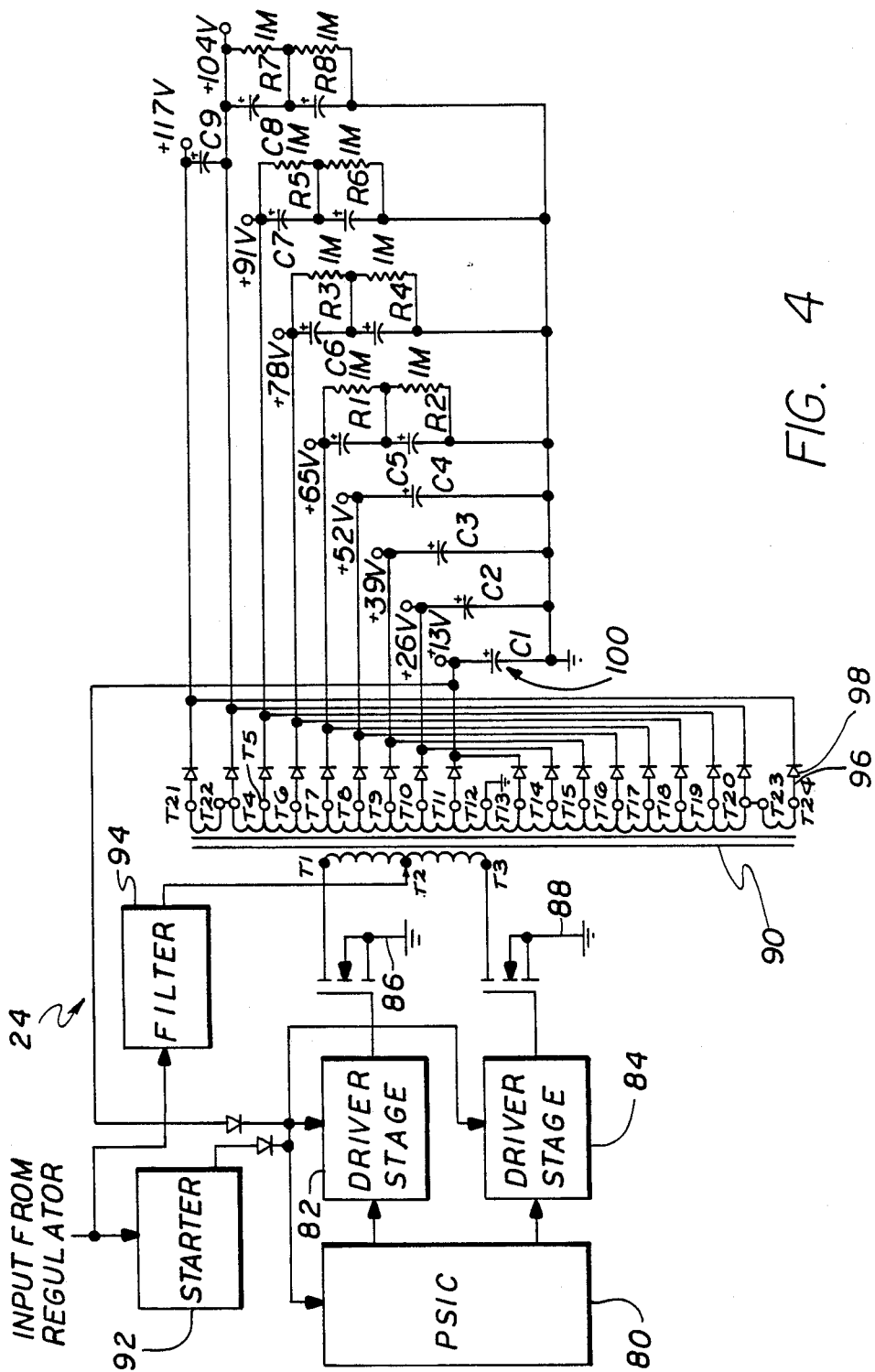
FIG. 4 is a simplified diagramatic representation of the DC to DC converter utilized in the envelope amplifier of the present invention.

A simplified diagramatic representation of the DC to DC converter 24 is shown in FIG. 4. A power supply integrated circuit (PSIC) 80 provides clock drive to a pair of complementary drive stages 82 and 84. The drive stages 82 and 84 drive switching transistors 86 and 88 respectively which in turn drive the primary of a transformer 90. A plurality of rectified filtered DC outputs are provided by pairs of taps from the secondary of the transformer 90, e.g. T11 and T13, diodes 98, and one or more elements of the RC network of capacitors C1 through C9 and resistors R1 through R8. In operation, a starter circuit 92 receives input from the regulator 22 and initiates the operation of the power supply integrated circuit 80 and the drive stages 82 and 84. Power is subsequently supplied to the PSIC 80 and the drive stages 82 and 84 by a rectified DC output (e.g. 13 volts) of the transformer 90. The DC to DC converter 24 thus provides multiple output voltage levels to the switches 26 through 38.

Figure 5:
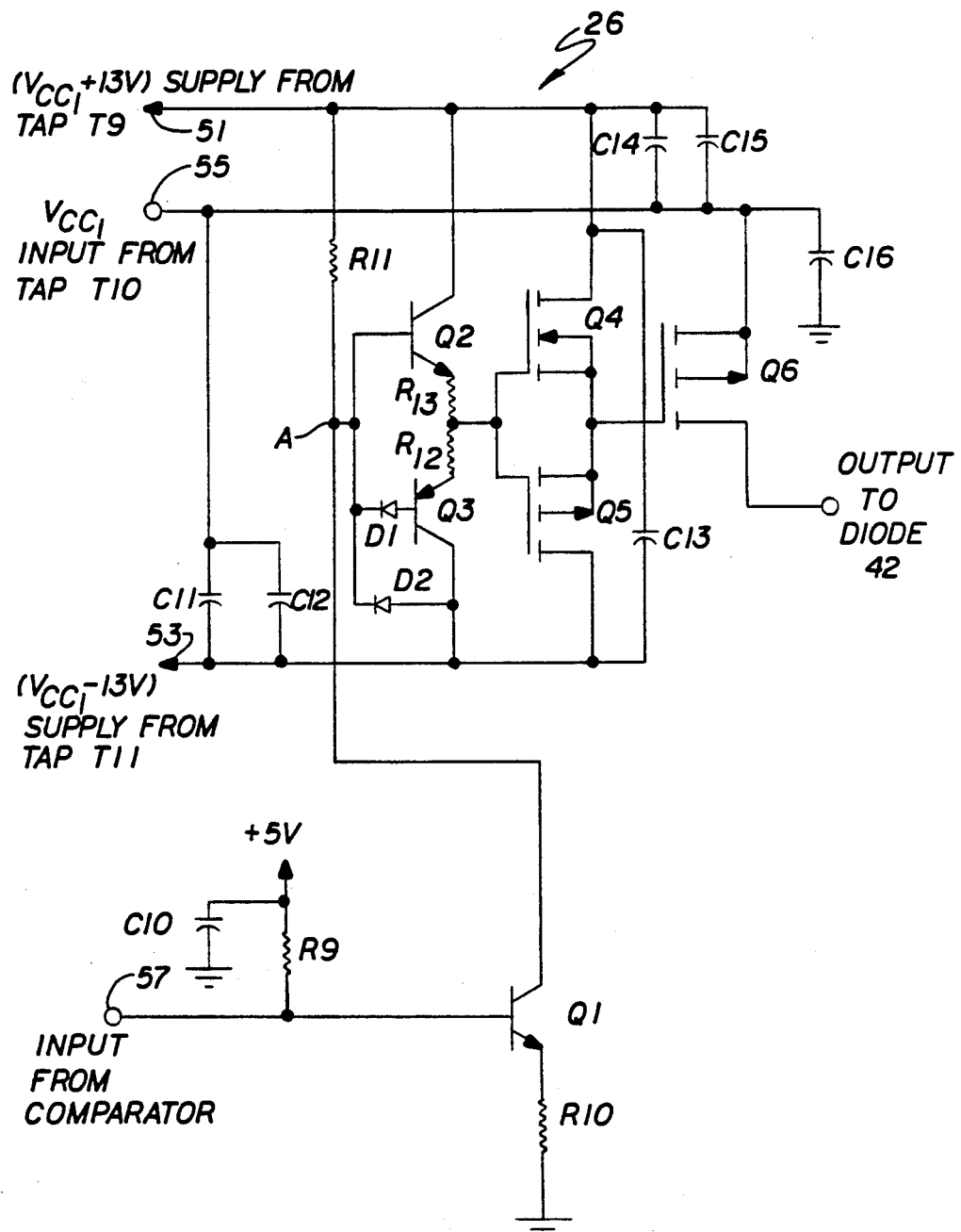
FIG. 5 is schematic diagram illustrating a typical power switch suitable for use in connection with the envelope amplifier of the present invention.

The switches 26-38 allow the comparator 60 to select appropriate output levels of the DC to DC converter for switching onto the output bus 56 in response to variations in the detected envelope input voltage. An illustrative implementation of a typical power switch 26 is shown in FIG. 5. For efficiency, the switch is floated about the supply voltage $V_{CC1}$ by taps T9/T15 and T11/T13 at 51 and 53 respectively. These taps are adjacent to the tap T10/T14 which provides the supply voltage $V_{CC1}$ at 55 for the switch 26.

Input from the comparator 60 turns on transistor Q1 which pulls down the voltage at point A turning on transistor Q3. Q3 then activates transistors Q5 and Q6. When Q6 is on, the input voltage from the tap T10 at 55 is passed to the output bus 56. When the input from the comparator 60 is removed, Q1 and Q3 go off, Q2 and Q4 go on, Q6 goes off, and the switch input 55 is isolated from the output bus 56 via a diode e.g. 42.

Figure 6:
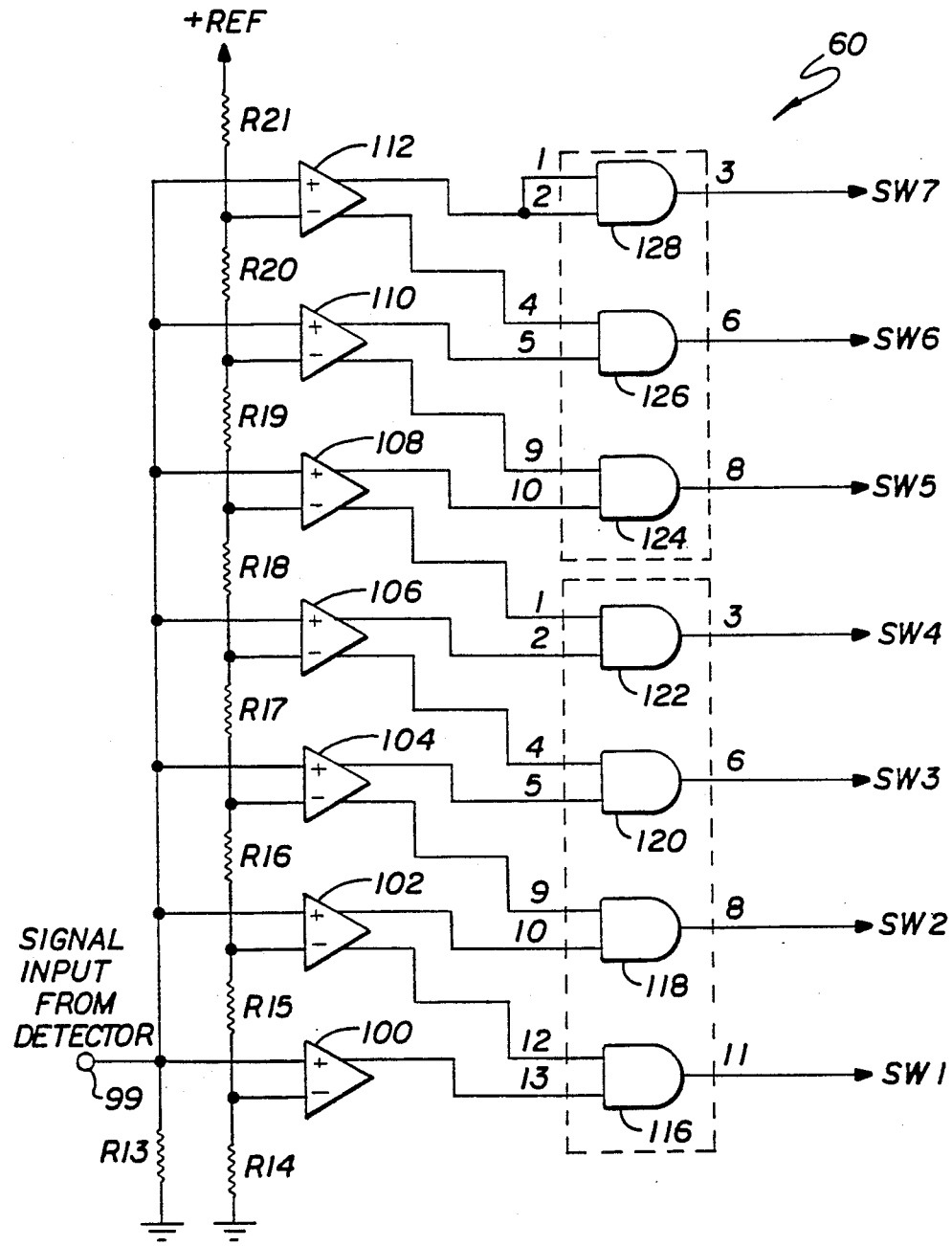
FIG. 6 is a schematic diagram of the comparator used in the envelope amplifier of the present invention.

FIG. 6 shows a illustrative implementation of the comparator 60. The detected envelope is received at the input terminal 99 from the detector 16. A voltage drop is developed across a resistor R13 which supplies the input to a plurality of operational amplifiers 100-112. The operational amplifiers act as comparators. The reference inputs are provided by a voltage divider network of resistors R14-R21, which are connected between a reference voltage (+) and ground. Thus, for example, op amp 100 compares the envelope input at its (+) terminal with the reference voltage at the junction of the resistors R14 and R15. With the exception of the first op amp 100, each op amp provides complementary outputs O and O' to two of the AND gates 116-128. This allows each op amp to turn off the output gate of the preceding op amp whenever it is activated. For example, since op amp 100 has a single output, AND gate 116 will be on whenever the first op amp 100 is on and the second op amp 102 is off. When the envelope input voltage increases above the threshold of the second op amp 102, the second op amp 102 is activated, its O output goes high and its O' output goes low. This turns off AND gate 116 and turns on AND gate 118. Thus, the AND gates 116-128 selectively activate switches 26-38 respectively, depending on the amplitude of the input signal.

In operation, and in reference to FIG. 1, when an input signal S(t) of the form shown in FIG. 7(a) is received by the detector at point 'a', the detector 16 outputs a signal at point 'b' of the form shown in FIG. 7(b). The envelope amplifier 20 of the present invention outputs an amplified quantized replica of the input envelope at point 'c' of the form shown in FIG. 7(c). This signal provides the current capability, hence the power capability, to power the RF amplifier 14 to efficiently replicate the envelope of the input signal. The signal input to the RF amplifier 14 at point 'd' is the phase and frequency information of the input signal S(t). The envelope has been removed from this signal by the limiter 12 so that the signal has the form shown in FIG. 7(d). The RF amplifier 14 provides the system output at point 'e' of the form shown in FIG. 7(e). Switching losses are mitigated in the present invention by the switching of relatively small amounts of power.

While the high efficiency envelope amplifier of the present invention has been described with reference to an illustrative embodiment for a particular application, it is understood that the invention is not limited thereto. Those of ordinary skill in the art and access to the teachings provided above will recognize additional modifications, applications, and embodiments within the scope thereof. For example, the invention is not limited to a particular implementation of the power supply, the power switches, or the comparator. While the present invention provides an power efficient envelope amplifier of particular utility in high efficiency amplifiers using the EER technique, the invention is not limited thereto. The invention may be used in any system where it is desired to provide a quantized replica of an input signal.

It is therefore intended by the appended claims to cover any and all such modifications, applications and embodiments. Thus,

What is claimed is:

1. A high frequency amplifier for an input signal having variable amplitude including:

limiter means for removing the amplitude variations from said input signal;

detector means for detecting amplitude variations in said input signal;

envelope amplification means for amplifying said detected amplitude variations, said envelope amplification means including:
- a power supply with a DC to DC converter providing plural parallel power taps;
- a plurality of switches, each switch having a control terminal and being input connected to one of said power taps and output connected to the output of said amplifier for selectively applying the voltage at said power tap to said output terminal; and
- a comparator directly connected at the input thereof to the input terminal of said amplifier and at the output thereof to the control terminal of each of said switches for comparing the amplitude of an input signal to one of several threshold levels and selectively and individually activating each of said switches in response thereto; and means for combining the output of said limiter means with the output of said envelope amplification means.

* * * * *